(12) United States Patent
Yamaguchi et al.

(10) Patent No.: US 12,139,788 B2
(45) Date of Patent: Nov. 12, 2024

(54) CLEANING APPARATUS FOR COMPONENT FOR SEMICONDUCTOR PRODUCTION APPARATUS, CLEANING METHOD FOR COMPONENT OF SEMICONDUCTOR PRODUCTION APPARATUS, AND CLEANING SYSTEM FOR COMPONENT OF SEMICONDUCTOR PRODUCTION APPARATUS

(71) Applicant: TAIYO NIPPON SANSO CORPORATION, Tokyo (JP)

(72) Inventors: Akira Yamaguchi, Musashino (JP); Tadanobu Arimura, Tsukuba (JP)

(73) Assignee: TAIYO NIPPON SANSO CORPORATION, Tokyo (JP)

( * ) Notice: Subject to any disclaimer, the term of this patent is extended or adjusted under 35 U.S.C. 154(b) by 686 days.

(21) Appl. No.: 17/293,256

(22) PCT Filed: Oct. 25, 2019

(86) PCT No.: PCT/JP2019/041870
§ 371 (c)(1),
(2) Date: May 12, 2021

(87) PCT Pub. No.: WO2020/100554
PCT Pub. Date: May 22, 2020

(65) Prior Publication Data
US 2022/0002864 A1     Jan. 6, 2022

(30) Foreign Application Priority Data

Nov. 16, 2018 (JP) ................................. 2018-215791

(51) Int. Cl.
C23C 16/44   (2006.01)
H01L 21/02   (2006.01)
(Continued)

(52) U.S. Cl.
CPC .... *C23C 16/4405* (2013.01); *H01L 21/02041* (2013.01); *H01L 21/67028* (2013.01);
(Continued)

(58) Field of Classification Search
CPC . C23C 16/4405; C23C 16/34; C23C 16/4401; H01L 21/67109; H01L 21/67028; H01L 21/02041; H01L 21/67098
See application file for complete search history.

(56) References Cited

U.S. PATENT DOCUMENTS 5,000,113 A * 3/1991 Wang .................... C23C 16/402
156/345.43
8,075,789 B1 * 12/2011 Littau ............... H01J 37/32862
134/1.1
(Continued)

FOREIGN PATENT DOCUMENTS

CN   1638026   7/2005
CN   101325160  12/2008
(Continued)

OTHER PUBLICATIONS

Machine Translation of JP H0-7249585 A to Tsukune et al. (Year: 1995).*
(Continued)

Primary Examiner — Benjamin L Osterhout
(74) Attorney, Agent, or Firm — Nixon & Vanderhye P.C.

(57) ABSTRACT

The object of the present invention is to provide a cleaning apparatus for a component of a semiconductor production apparatus, which is capable of preventing the attachment of reaction products into the cleaning processing furnace by a simple structure, the present invention provides a cleaning apparatus (1) for a component of a semiconductor production apparatus including: a cleaning processing furnace (2) which is configured to house the component (10) of a
(Continued)

semiconductor production apparatus; a heating device (3); a gas introduction pipe (4); a gas discharge pipe (5); a decompression device (6); a first temperature control device (7); a second temperature control device (8); and a purge gas supply device (9).

13 Claims, 6 Drawing Sheets

(51) Int. Cl.
    *H01L 21/67*            (2006.01)
    *C23C 16/34*            (2006.01)

(52) U.S. Cl.
    CPC ........ *H01L 21/67098* (2013.01); *C23C 16/34* (2013.01); *C23C 16/4401* (2013.01); *H01L 21/67109* (2013.01)

(56) References Cited

U.S. PATENT DOCUMENTS

| | | | |
|---|---|---|---|
| 2002/0062837 | A1 | 5/2002 | Miyanaga et al. |
| 2011/0030615 | A1* | 2/2011 | Griffin .............. C23C 16/45565 134/19 |
| 2011/0052833 | A1* | 3/2011 | Hanawa ............ C23C 16/45574 134/1.1 |
| 2012/0000490 | A1* | 1/2012 | Chung .............. C23C 16/45576 134/22.12 |
| 2012/0234945 | A1* | 9/2012 | Olgado .................. B05B 1/005 239/589 |
| 2015/0275356 | A1 | 10/2015 | Okada |
| 2019/0221406 | A1* | 7/2019 | Funakubo ......... H01L 21/31144 |
| 2020/0126816 | A1* | 4/2020 | Saito ................. H01L 21/67109 |

FOREIGN PATENT DOCUMENTS

| | | | |
|---|---|---|---|
| CN | 101622692 | | 1/2010 |
| CN | 102693892 | | 9/2012 |
| JP | 7-249585 | A | 9/1995 |
| JP | 11-087326 | | 3/1999 |
| JP | 2001-515282 | | 9/2001 |
| JP | 2007-109928 | | 4/2007 |
| JP | 2010-245376 | | 10/2010 |
| JP | 2011-501429 | | 1/2011 |
| JP | 2013-062342 | | 4/2013 |
| JP | 2015-073132 | | 4/2015 |
| JP | 2015-192063 | | 11/2015 |
| JP | 2017-168607 | | 9/2017 |
| JP | 2018-041883 | | 3/2018 |
| KR | 10-2011-0139097 | | 12/2011 |
| WO | 2009/051288 | | 4/2009 |
| WO | WO-2010129289 | A2 * | 11/2010 ........... C23C 16/301 |

OTHER PUBLICATIONS

International Search Report for PCT/JP2019/041870, mailed Jan. 28, 2020, 6 pages.
Written Opinion of the ISA for PCT/JP2019/041870, mailed Jan. 28, 2020, 5 pages.
Office Action dated Jul. 5, 2022 issued in Chinese Application No. 201980074607.5 with partial English translation (13 pages).
Extended European Search Report dated Dec. 23, 2021 issued in European Applicantion No. 19884724.6 (9 pages).

* cited by examiner

CLEANING APPARATUS FOR COMPONENT FOR SEMICONDUCTOR PRODUCTION APPARATUS, CLEANING METHOD FOR COMPONENT OF SEMICONDUCTOR PRODUCTION APPARATUS, AND CLEANING SYSTEM FOR COMPONENT OF SEMICONDUCTOR PRODUCTION APPARATUS

This application is the U.S. national phase of International Application No. PCT/JP2019/041870 filed 25 Oct. 2019, which designated the U.S. and claims priority to JP Patent Application No. 2018-215791 filed 16 Nov. 2018, the entire contents of each of which are hereby incorporated by reference.

TECHNICAL FIELD

The present invention relates to a cleaning apparatus for a component of a semiconductor production apparatus, a cleaning method for a component of a semiconductor production apparatus, and a cleaning system for a component of a semiconductor production apparatus.

BACKGROUND ART

As a thin-film production apparatus for producing a thin film on a substrate, a semiconductor production apparatus using a vapor phase growth method such as MOCVD (metal organic chemical vapor deposition) and PECVD (plasma-enhanced chemical vapor deposition) is known. In the semiconductor production apparatus, when a thin film of a compound semiconductor is produced on a base, the compound semiconductor is also attached to a component of the film producing furnace (hereinafter referred to as a component of a semiconductor production apparatus). Therefore, it is necessary to regularly clean these components of a semiconductor production apparatus. As a cleaning method of the component of the semiconductor production apparatus, a method of heating the component of the semiconductor production apparatus housed in the cleaning processing furnace, introducing an etching gas into the cleaning processing furnace, and cleaning the component by a vapor phase reaction is common.

However, when a component of the semiconductor production apparatus to which a nitride-based compound semiconductor such as gallium nitride (GaN), aluminum nitride (AlN), or indium nitride (InN) is attached is cleaned with a chlorine-based gas as an etching gas, chlorides such as gallium chloride ($GaCl_3$), aluminum chloride ($AlCl_3$), and indium chloride ($InCl_3$) are produced as the reaction product.

For example, gallium chloride has a boiling point of 201° C. and is solid at room temperature. Therefore, even in a furnace in which the treatment temperature at the time of cleaning is close to 1000° C., precipitation occurs at a place in which the temperature is lower than 200° C. at atmospheric pressure. In addition, gallium chloride has deliquescent property and reacts with water to generate hydrogen chloride. Furthermore, the generated hydrogen chloride is converted to hydrochloric acid and corrodes the metal. That is, when gallium chloride attaches to a place at which the temperature is low, such as a metal flange constituting the cleaning processing furnace of the cleaning apparatus, the cleaning processing furnace is opened to transport an object to be cleaned, and gallium chloride is exposed to the atmosphere and metal components inside the furnace are corroded.

As a method for solving the problems of chlorides produced when cleaning the component of the semiconductor production apparatus, a method of selecting an etching gas which produces a reaction product having a low boiling point can be considered. In this method, even if a portion having a low temperature is present in the cleaning processing furnace, the reaction product does not precipitate and attach, is discharged as a gas from the reaction treatment furnace, and can be captured by cooling in an intended trap. However, an etching gas having such characteristics and having an appropriate etching rate has not been found at the present time.

Methods for solving the problems of chlorides above are disclosed in Patent Document 1 and Patent Document 2. Patent Document 1 discloses a method of converting a chlorine-based gas, which is a cleaning gas, into plasma and then supplying it into a furnace of a film production apparatus. As a result, a reaction product having a high vapor pressure can be obtained, so that it is possible to prevent the reaction product from attaching due to precipitation in the furnace. However, expensive equipment for generating remote plasma is required separately.

Further, Patent Document 2 discloses a cleaning apparatus and a cleaning method in which a cooling plate is installed in advance near the discharge port of the cleaning processing furnace as a device for capturing reaction products, after the reaction product is once captured in the cooling plate, the temperature of the cooling plate is raised, the reaction product is evaporated, and the reaction product is supplemented by a trap in the subsequent stage. However, if the temperature difference between the cooling plate and other components in the cleaning processing furnace is small, there is a problem in that not all the precipitated reaction products attach to the cooling plate and attach to other places. In addition, there is a problem in that since it is necessary to add these additional devices to the cleaning apparatus the cleaning method becomes complicated, and the productivity is lowered.

PRIOR ART DOCUMENTS

Patent Literature

Patent Document 1 Japanese Unexamined Patent Application, First Publication No. 2013-062342
Patent Document 2 Japanese Unexamined Patent Application, First Publication No. 2015-073132

SUMMARY OF INVENTION

Problem to be Solved by the Invention

The present invention has been made in view of the above circumstances, and an object of the present invention is to provide a cleaning apparatus for a component of a semiconductor production apparatus which is capable of preventing the attachment of reaction products into the cleaning processing furnace by a simple structure, a cleaning method for a component of a semiconductor production apparatus, and a cleaning system for a component of the semiconductor production apparatus.

Means for Solving the Problem

In order solve the problems above, the present invention provides the following cleaning apparatus for a component of a semiconductor production apparatus, a cleaning method for a component of a semiconductor production apparatus, and a cleaning system for a component of a semiconductor production apparatus.

[1] A cleaning apparatus for a component of a semiconductor production apparatus on which a semiconductor is attached,
wherein the cleaning apparatus includes:
a cleaning processing furnace which is configured to house the component of a semiconductor production apparatus;
a heating device which is configured to heat the component of a semiconductor production apparatus in the cleaning processing furnace;
a decompression device which is configured to evacuate the inside of the cleaning processing furnace;
a gas introduction pipe which is configured to introduce a cleaning gas capable of reacting with the semiconductor into the cleaning processing furnace;
a gas discharge pipe which is configured to discharge a reaction product of the semiconductor and the cleaning gas from the cleaning processing furnace;
a first temperature control device which is configured to maintain a temperature of an inner surface of the cleaning processing furnace within a required temperature range; and
a second temperature control device which is configured to maintain a temperature inside of the gas discharge pipe within a required temperature range.

[2] The cleaning apparatus for a component of a semiconductor production apparatus according to [1], wherein the cleaning processing furnace includes a reaction tube which is made of quartz and has an opening at at least one end, and a first flange which is made of metal and configured to close the opening.

[3] The cleaning apparatus for a component of a semiconductor production apparatus according to [1], wherein the cleaning processing furnace includes a reaction tube which is made of quartz and has openings at both ends, a first flange which is made of metal and configured to close the opening at one end, and a second flange which is made of metal and configured to close the opening at the other end.

[4] The cleaning apparatus for a component of a semiconductor production apparatus according to [2] or [3], wherein the first temperature control device includes one or more temperature control mechanisms which are configured to independently control a temperature of one or more portions at the surface of the cleaning processing furnace in the reaction tube and the flange.

[5] The cleaning apparatus for a component of a semiconductor production apparatus according to [4], wherein at least one of the temperature control mechanisms is provided on one or both of the inner surface of the flange facing the inside of the cleaning processing furnace and the surface of the flange opposite to the inner surface.

[6] The cleaning apparatus for a component of a semiconductor production apparatus according to [4] or [5], wherein the temperature control mechanism is based on one or both of the supply of liquid and the circulation of liquid.

[7] The cleaning apparatus for a component of a semiconductor production apparatus according to [6], wherein the temperature control mechanism includes:
one or more heat exchange units comprising a flow path of the liquid which is provided on one or both of the inner surface of the flange facing the inside of the cleaning processing furnace and the surface of the flange opposite to the inner surface;
one or more supply paths which are configured to supply the liquid into the heat exchange unit;
one or more discharge paths which are configured to discharge the liquid from the heat exchange unit;
one or more return paths which are configured to branch from the one or more discharge paths, and join with the one or more supply paths to return a part of the liquid in the discharge path to the supply path;
one or more first on-off valves which are provided in the supply path and configured to adjust an amount of the liquid supplied into the heat exchange unit stepwise or continuously;
one or more temperature measuring devices provided with the discharge path; and
one or more pumping devices which are provided with the return path.

[8] The cleaning apparatus for a component of a semiconductor production apparatus according to any one of [1] to [7], wherein the cleaning apparatus further includes a purge gas supply mechanism which is configured to supply a temperature-controlled purge gas from the outside of the cleaning processing furnace toward gaps of the cleaning processing furnace.

[9] The cleaning apparatus for a component of a semiconductor production apparatus according to any one of [1] to [8], wherein the compound semiconductor is a nitride-based compound semiconductor which is represented by a general formula: $Al_xIn_yGa_{1-x-y}N$ (wherein x and y satisfy $0 \le x < 1$, $0 \le y < 1$, $0 \le x+y < 1$), and the cleaning gas is a chlorine-based gas.

[10] A cleaning method for a component of a semiconductor production apparatus, wherein the cleaning method uses the cleaning apparatus according to any one of [1] to [8], and includes:
a housing step in which the component of a semiconductor production apparatus on which a semiconductor is attached is housed in the cleaning processing furnace;
a purging step in which while heating the component of a semiconductor production apparatus, an inside of the cleaning processing furnace is evacuated repeatedly to purge the inside of the cleaning processing furnace;
a cleaning step in which a cleaning gas is introduced into the cleaning processing furnace to clean the component of a semiconductor production apparatus; and
a discharging step in which evacuation inside of the cleaning processing furnace is carried out repeatedly to discharge a reaction product between the semiconductor and the cleaning gas from the cleaning processing furnace into the gas discharge path;
during introducing the cleaning gas into the cleaning processing furnace to clean the component of a semiconductor production apparatus, evacuating repeatedly an inside of the cleaning processing furnace, and discharging the reaction product between the semiconductor and the cleaning gas from the cleaning processing furnace into the gas discharge path, a temperature of an inner surface of the cleaning processing furnace is maintained within a required range, and during discharging the reaction product between the semiconductor and the cleaning gas from the cleaning processing furnace into the gas discharge path, a temperature inside of the discharge path is maintained within a required range.

[11] A cleaning system for a component of a semiconductor production apparatus, wherein the cleaning system includes:
a semiconductor production apparatus which is configured to produce a layer or a film of a semiconductor on a base in a film producing furnace in which the component of a semiconductor production apparatus is installed; and
a cleaning apparatus for a component of a semiconductor production apparatus according to any one of [1] to [9], which is configured to clean the component of a semiconductor production apparatus on which a semiconductor is attached.

[12] A cleaning system for a component of a semiconductor production apparatus according to [11], wherein the cleaning system further includes a transfer device which is configured to deliver the component of a semiconductor production apparatus between the semiconductor production apparatus and the cleaning apparatus for a component of a semiconductor production apparatus.

[13] The cleaning system for a component of a semiconductor production apparatus according to [12], wherein a transport processing space in the transfer device communicates with an inside of the cleaning processing furnace.

[14] The cleaning system for a component of a semiconductor production apparatus according to [13], wherein the transfer device includes one or more gate valves which are configured to partition the transfer processing space into two or more.

Effects of the Invention

According to the cleaning apparatus for a component of a semiconductor production apparatus, the cleaning method for a component of a semiconductor production apparatus, and the cleaning system for a component of a semiconductor production apparatus, attachment of reaction products in the cleaning processing furnace can be prevented by a simple structure and simple control. Therefore, even when the reaction product is chloride and moisture attaches to the inside of the furnace, corrosion inside the furnace can be prevented.

DETAILED DESCRIPTION OF THE PREFERRED EMBODIMENTS

Figure 1:
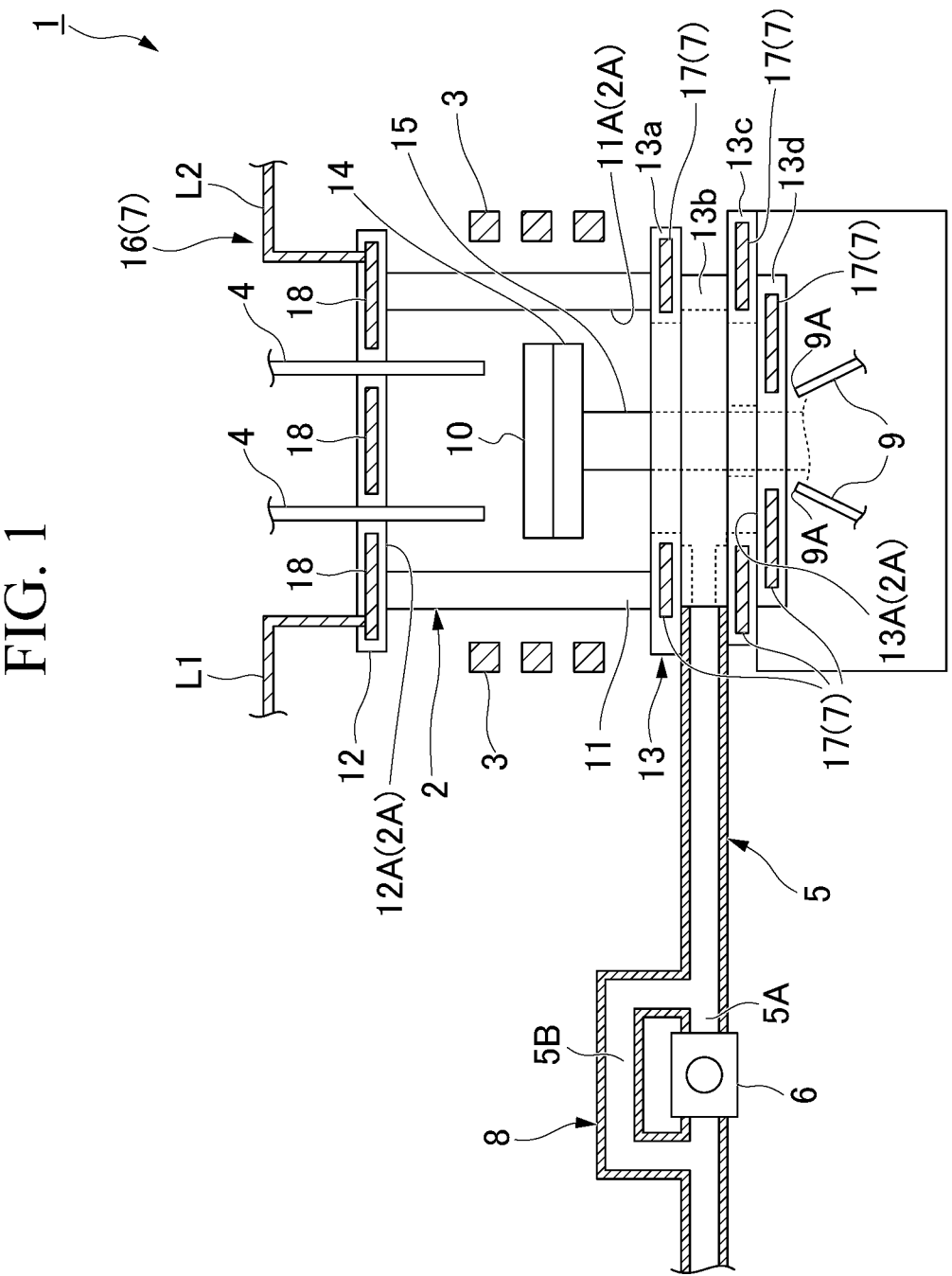
FIG. 1 is a cross-sectional diagram schematically showing a configuration of a cleaning apparatus for a component of a semiconductor production apparatus according to an embodiment of the present invention.

Hereinafter, a cleaning apparatus for a component of a semiconductor production apparatus according to an embodiment of the present invention will be described in detail with reference to the drawings together with a cleaning system including the cleaning apparatus and the cleaning method.

In addition, in the drawings used in the following description, in order to make the features easy to understand, the featured parts may be enlarged for convenience, and the dimensional ratio of each component may not be the same as the actual one.

<Cleaning Apparatus for Component of Semiconductor Production Apparatus>

First, a configuration of a cleaning apparatus for a component of a semiconductor production apparatus according to an embodiment according of the present will be described. FIG. 1 is a cross-sectional diagram schematically showing a configuration of a cleaning apparatus for a component of a semiconductor production apparatus according to an embodiment of the present invention.

The cleaning apparatus for a component of a semiconductor production apparatus (hereinafter, simply referred to as "cleaning apparatus") according to the present embodiment is a cleaning apparatus for cleaning components in which a compound semiconductor is deposited (attached) by film production in a film producing furnace of a semiconductor production apparatus (hereinafter referred to as component of a semiconductor production apparatus).

As shown in FIG. 1, the cleaning apparatus 1 of the present embodiment mainly includes a cleaning processing furnace 2, a heating device 3, a gas introduction pipe 4, a gas discharge pipe 5, a decompression device 6, a first temperature control device 7, a second temperature control device 8, and a purge gas supply device 9.

A component 10 to be cleaned of the semiconductor production apparatus is not particularly limited as long as it has a compound semiconductor (semiconductor) attached. Examples of the component of the semiconductor production apparatus include a susceptor installed in a furnace of a MOCVD film producing device and a PECVD thin film production device. Further, the material of the component of the semiconductor production apparatus is not particularly limited, but a component made of quartz, or SiC, a component coated with SiC, and the like can be used.

The compound semiconductor to be removed is not particularly limited. In the present embodiment, when the compound semiconductor is a nitride-based compound semiconductor which is represented by a general formula: $Al_xIn_yGa_{1-x-y}N$ (wherein x and y satisfy $0 \leq x < 1$, $0 \leq y < 1$, $0 \leq x+y < 1$), and specifically, when the compound semiconductor is any one of gallium nitride (GaN), aluminum nitride (AlN), and indium nitride (InN), particularly remarkable effects can be obtained.

The cleaning processing furnace 2 has a space which houses and cleans the component 10 of the semiconductor production apparatus. The configuration of the cleaning processing furnace 2 is not particularly limited. The cleaning processing furnace 2 is a vertical mode furnace and includes a reaction tube 11 which is made of quartz and has an axial direction in the vertical direction and has an upper end (one end) opening and a lower end (the other end) opening, an upper flange (first flange) 12 which is made of metal and closes the upper end opening, and a lower flange (second flange) 13 which is made of metal and closes the lower end opening. One or more heat resistant O-rings (not shown) are provided at the connection portion between the reaction tube 11 and the upper flange 12 and the lower flange 13, respectively. In other words, the reaction tube 11, the upper flange 12 and the lower flange 13 are connected to each other via one or more heat resistant O-rings (not shown).

A base (stage) 14 for mounting the component 10 of the semiconductor production apparatus is provided in the cleaning processing furnace 2. The base 14 is pivotally supported by a rotating shaft 15. The rotating shaft 15 is provided so as to penetrate the lower flange 13. The base 14 is rotatable in the cleaning processing furnace 2 together with the rotating shaft 15.

In the cleaning processing furnace 2, a part or all of at least one of the upper flange 12 and the lower flange 13 can be opened. In the present embodiment, the lower flange 13 is configured by laminating four flanges 13a to 13d in order from the reaction tube 11 side via a heat resistant O-ring or the like. Of the lower flange 13, the lowermost flange 13d is an elevating flange, and the inside of the cleaning processing furnace 2 can be opened between the flange 13c on the reaction tube 11 side and the elevating flange 13d. By raising and lowering the base 14 together with the elevating flange 13d, the component 10 of the semiconductor production apparatus can be carried in and out from below the cleaning processing furnace 2. Of the four flanges 13a to 13d, the flanges 13a to 13c may be welded.

The heating device 3 is a heat source for heating the component 10 of the semiconductor production apparatus in the cleaning processing furnace 2. In the present embodiment, the heating device 3 is provided outside the cleaning processing furnace 2. The heating device 3 is not particularly limited as long as it can heat the component 10 of the semiconductor production apparatus in the cleaning processing furnace 2 to a required temperature. Examples of the heating device 3 include a heating coil of a high-frequency induction heating device, a heating lamp, and a heating heater. Among these, it is preferable to use a heating coil capable of heating the component 10 of the semiconductor production apparatus up to about 1000° C. as the heating device 3. When a heating coil is used as the heating device 3, it is preferable to provide it so as to wind around the reaction tube 11.

The gas introduction pipe 4 is a gas introduction path for introducing an inert gas for purging, a cleaning gas which reacts with the compound semiconductor, and a carrier gas used together with the cleaning gas into the cleaning processing furnace 2. In the present embodiment, the gas introduction pipe 4 is provided so as to penetrate the upper flange 12.

The cleaning gas used in the cleaning apparatus 1 of the present embodiment is not particularly limited, and can be appropriately selected depending on the type of the compound semiconductor (semiconductor) attached to the component 10 of the semiconductor production apparatus. When the compound semiconductor is the nitride compound semiconductor above, a chlorine-based gas containing chlorine in the molecule such as $Cl_2$, HCl, $SiCl_4$, $SiHCl_3$, $SiH_2Cl_2$, $SiH_3Cl$, $BCl_3$, $CHCl_3$, $CH_2Cl_2$, and $CH_3Cl$ can be used. Among these, chlorine ($Cl_2$) gas is particularly preferred. Further, as the cleaning gas, one or a mixture of two or more of the chlorine-based gases above may be used, or one of which the concentration is adjusted with a carrier gas such as nitrogen may be used.

The gas discharge pipe 5 is a gas discharge path for discharging the purge gas introduced into the cleaning processing furnace, and the reaction product of the compound semiconductor attached to the component 10 of the semiconductor production apparatus and the cleaning gas from the cleaning processing furnace 2. In the present embodiment, the gas discharge pipe 5 is provided so as to penetrate the lower flange 13 (specifically, the flange 13b). Further, the gas discharge pipe 5 may have a main path 5A and a bypass path 5B which branches from the main path 5A and then joins again. In this case, it is preferable that the main path 5A and the bypass path 5B each be provided with an on-off valve (not shown) for switching.

Further, on the downstream side of the gas discharge pipe 5, a trap (not shown) for cooling and aggregating and supplementing the reaction product discharged from the cleaning processing furnace 2 is provided. Further, a chlorine-based gas abatement device (not shown) is provided on the downstream side of the gas discharge pipe 5.

The decompression device 6 is provided in the main path 5A of the gas discharge pipe 5 in order to evacuate the inside of the cleaning processing furnace 2. The decompression device 6 is not particularly limited as long as it allows the inside of the cleaning processing furnace 2 to reach a required degree of vacuum. As such a decompression device 6, a rotary pump, a dry pump, or the like can be used. Among these, it is preferable to use a dry pump as the decompression device 6.

The first temperature control device 7 is provided to maintain the temperature of the inner surface 2A of the cleaning processing furnace 2 serving as the gas contact portion within a required range. The first temperature control device 7 includes a temperature control mechanism 16 which controls the temperature at the inner surface 12A of the upper flange 12 facing the inside of the furnace, and a temperature control mechanism 1 which controls the temperature at the inner surface 13A of the lower flange 13 facing the inside of the furnace. That is, the first temperature control device 7 can independently control the temperature of the upper flange 12 and the lower flange 13. The first temperature control device 7 is preferably provided so as to maintain the temperature of the connection portion between the reaction tube 11 and the upper flange 12 and the connection portion between the reaction tube 11 and the lower flange 13 within a required range. As a result, the O-ring provided at the connection portion between the reaction tube 11 and the upper flange 12 and the lower flange 13 can be kept below the heat resistant temperature.

Figure 2:
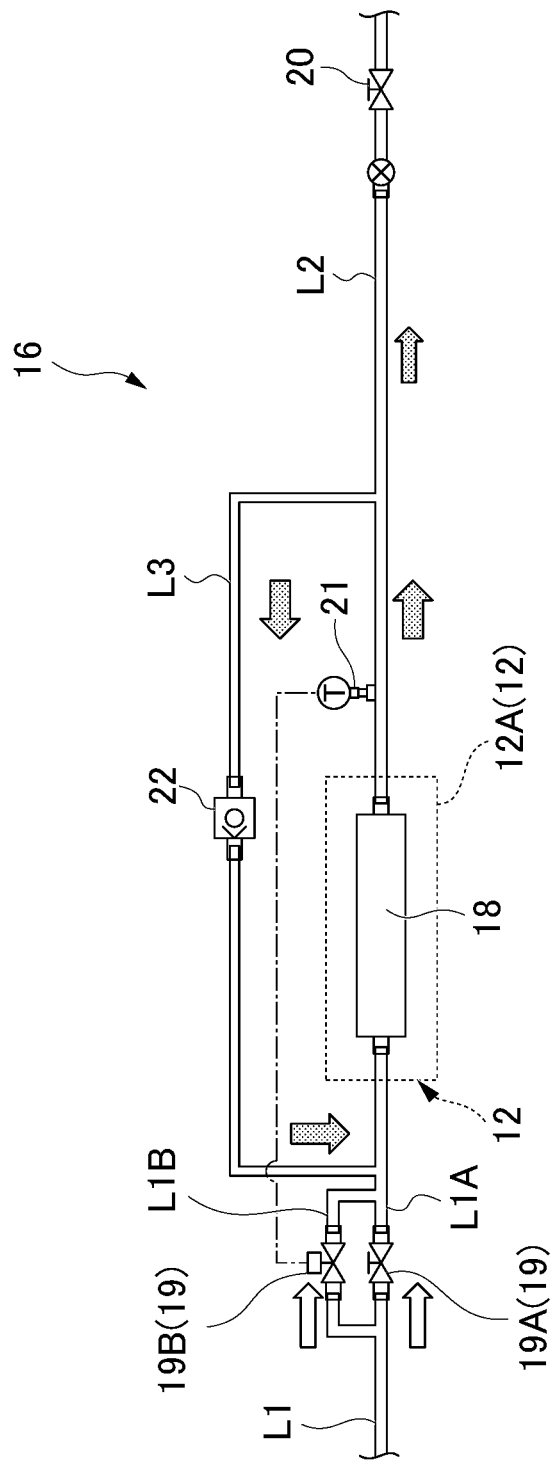
FIG. 2 is a diagram showing a partial configuration of a temperature control device provided on an upper flange.

FIG. 2 is a diagram showing an example of the configuration of the temperature control mechanism 16 provided on the upper flange 12. The temperature control mechanism 16 is not particularly limited as long as it can control the temperature of the inner surface 12A of the upper flange 12 within a required temperature range. As the temperature control mechanism 16, a mechanism which controls the temperature of the inner surface 12A of the upper flange 12 by heat exchange with the temperature-controlled liquid is preferable.

Specifically, the temperature control mechanism 16 includes a heat exchange unit 18, a supply path L1 for supplying liquid to the heat exchange unit 18, a discharge path L2 for discharging the liquid from the heat exchange unit 18, a return path L3 which branches from the discharge path L2 and joins the supply path L1, a first on-off valve 19, a second on-off valve 20, a thermometer (temperature measuring device) 21, and a pump (pumping device) 22.

The heat exchange unit 18 is a liquid flow path provided inside the upper flange 12. By supplying liquid having a required temperature to this flow path, heat exchange is performed between the heat exchange unit 18 and the upper flange 12. That is, when it is desired to cool the upper flange 12, liquid having a temperature lower than that of the upper flange 12 may be supplied to the heat exchange unit 18. Further, when it is desired to heat the upper flange 12, liquid having a temperature higher than that of the upper flange 12 may be supplied to the heat exchange unit 18. Further, when it is desired to maintain the upper flange 12 at a required temperature, liquid having a required temperature may be supplied to the heat exchange unit 18.

In the present embodiment, the configuration in which the heat exchange unit 18 is provided inside the upper flange 12 has been described as an example, but the present invention is not limited to this embodiment. The liquid flow path may be provided so as to be in contact with the surface of the upper flange 12 opposite to the inner surface 12A of the furnace. Further, at least one heat exchange unit 18 may be provided, and two or more heat exchange units 18 may be provided.

The supply path L1 is configured to have a pipe or the like provided for supplying the liquid into the heat exchange unit 18 from a supply source (not shown). The supply path L1 branches into the main path L1A and the sub-path L1B, joins again, and then is connected to the heat exchange unit 18.

The supply path L1 is provided with a first on-off valve 19 in order to adjust the amount of liquid supplied into the heat exchange unit 18 stepwise or continuously. Specifically, the first on-off valves 19A and 19B are provided in the main path L1A and the sub-path L1B constituting the supply path L1, respectively.

The first on-off valve 19A is controlled to a constant opening degree in order to constantly flow the liquid in the supply path L1 when the cleaning apparatus 1 is operated. By constantly supplying the liquid from the supply source into the heat exchange unit 18, the temperature of the upper flange 12 can be controlled to a heat resistant temperature or lower.

The first on-off valve 19B is electrically connected to a thermometer 21 described later, receives a control signal transmitted from the thermometer 21, and is controlled to a required opening degree. By using the first on-off valve 19A and the first on-off valve 19B in combination, the required amount of liquid can be supplied immediately, so that the response speed of temperature control is improved.

In the present embodiment, a configuration having one supply path L1 for supplying liquid into one heat exchange unit 18 has been described as an example, but the present embodiment is not limited this embodiment. One heat exchange unit 18 may have two or more supply paths L1. Two or more heat exchange units 18 may have a number of supply paths L1 corresponding to the number of the heat exchange units 18. Further, one supply path L1 may be branched to supply to two or more heat exchange units 18.

Further, in the present embodiment, the configuration in which the first on-off valves 19A and 19B are provided in the respective paths L1A and L1B branched from one supply path L1 has been described as an example, but the present invention is not limited to this embodiment. The first on-off valve 19 may be provided in each of the two or more supply paths L1. When one supply path L1 branches into two or more, the first on-off valve may be provided before the branch, or before and after the branch.

The discharge path L2 is configured to have a pipe or the like provided for discharging the liquid after heat exchange from the heat exchange unit 18. The discharge path L2 is provided with a thermometer 21 and a second on-off valve 20.

The thermometer 21 measures the temperature of the liquid discharged from the heat exchange unit 18. The thermometer 21 is electrically connected to the second on-off valve 19B, and transmits a control signal to the second on-off valve 19B according to the temperature of the liquid discharged from the heat exchange unit 18.

The second on-off valve 20 adjusts the amount of the liquid discharged from the heat exchange unit 18 to the outside of the system stepwise or continuously. Specifically, when the cleaning apparatus 1 is operated, the opening degree of the second on-off valve 20 is controlled according to the opening degree of the first on-off valve 19A. When the first on-off valves 19A and 19B are used together, the opening degree of the second on-off valve 20 is controlled according to the total opening degree thereof. When the pump 22 is provided in the return path L3 to circulate the liquid in the circulation path as described later, the second on-off valve 20 may be omitted.

In the present embodiment, the configuration having one discharge path L2 for discharging the liquid from one heat exchange unit 18 has been described as an example, but the present invention is not limited to this embodiment. One heat exchange unit 18 may have two or more discharge paths L2. Two or more heat exchange units 18 may have a number of discharge paths L2 corresponding to the number of the heat exchange units 18. Further, after being discharged from two or more heat exchange units 18 to the same number of discharge paths, they may be joined into one discharge path L2.

Further, in the present embodiment, the configuration in which one second on-off valve 20 is provided in one discharge path L2 has been described as an example, but the present invention is not limited to this embodiment. The second on-off valve 20 may be provided in each of the two or more discharge paths L2. When two or more discharge paths L2 join into one, the second on-off valve 20 may be provided in each discharge path L2 before the join, or the second on-off valve 20 may be provided in all of the respective discharge paths L2 before and after the join.

The return path L3 is configured to have a pipe which branches from the discharge path L2 and then joins the supply path L1, and is provided to return a part of the liquid after heat exchange in the discharge path L2 to the supply path L1.

Specifically, when a branch point is between the thermometer 21 of the discharge path L2 and the second on-off valve 20, and a joint point is the secondary side of the main path L1A and the sub-path L1B of the supply path L1, the path L3 is provided between the branch point and the joint point. That is, the temperature control mechanism 16 of the present embodiment includes a liquid circulation path including the supply path L1 from the joint point to the heat exchange unit 18, the heat exchange unit 18, the discharge path L2 from the heat exchange unit 18 to the branch point, and the return path L3.

Further, the return path L3 is provided with a pump 22 which pumps the liquid at a required pressure and flow rate. As a result, a part of the liquid discharged from the heat exchange unit 18 after heat exchange is returned to the supply path L1 at a required flow rate, mixed with the liquid in the supply path L1, and then supplied to the heat exchange unit 18 again. That is, the liquid is circulated in the circulation path.

In the present embodiment, the configuration having one return path L3 for returning the liquid from one discharge path L2 to one supply path L1 has been described as an example, but the present invention is not limited to this embodiment. Similar to the supply path L1 and the discharge path L2 described above, various modifications may be provided. Further, in the present embodiment, the configuration in which one pump 22 is provided in one return path L3 has been described as an example, but the present invention is not limited to this embodiment, and various modifications may be provided.

When the cleaning apparatus 1 is operated, the temperature control mechanism 16 controls the first on-off valve 19A to a constant opening degree to constantly flow the liquid in the supply path L1. Specifically, liquid is supplied from the supply source to the supply path L1. The liquid supplied from the supply path L1 to the heat exchange unit 18 is heat exchanged with the upper flange 12 and then discharged from the heat exchange unit 18 to the discharge path L2. A part of the liquid discharged to the discharge path L2 is returned from the return path L3 to the supply path L1, and the rest is discharged to the outside of the system via the second on-off valve 20 provided in the discharge path L2. The liquid returned to the supply path L1 is mixed with the liquid in the supply path L1 and then supplied to the heat exchange unit 18 again.

When the temperature of the upper flange 12 rises due to the radiant heat of the component 10 of the semiconductor production apparatus heated in the cleaning processing furnace 2, the temperature of the liquid heat exchanged with the upper flange 12 in the heat exchange unit 18 also rises. Further, since the liquid after heat exchange with the upper flange 12 is mixed with the liquid returned by the return path L3, the temperature of the liquid supplied from the supply path L1 to the heat exchange unit 18 (that is, the liquid in the circulation path) also rises.

When the temperature of the liquid in the circulation path measured by the thermometer 21 provided in the discharge path L2 exceeds the upper limit of the required temperature range, the liquid in the circulation path is cooled. Specifically, the first on-off valve 19B provided in the sub-path L1B is opened to increase the amount of liquid supplied from the supply source. At the same time, the output of the pump 22 is controlled to reduce the flow rate of the liquid returned from the return path L3, and the opening degree of the second on-off valve 20 provided in the discharge path L2 is increased to discharge the amount of liquid discharged to the outside of the system. In this way, by controlling the temperature of the liquid in the circulation path to a constant temperature within a required temperature range, it is possible to suppress the temperature rise of the upper flange 12.

On the other hand, when the heating of the component 10 of the semiconductor production apparatus is stopped in the cleaning processing furnace 2, the temperature of the upper flange 12 drops. When the temperature of the liquid in the circulation path measured by the thermometer 21 provided in the discharge path L2 is less than the lower limit of the required temperature range, the liquid in the circulation path is maintained. Specifically, the first on-off valve 19B provided in the sub-path L1B is closed. At the same time, the output of the pump 22 is controlled to increase the flow rate of the liquid returned from the return path L3, and the opening degree of the second on-off valve 20 provided in the discharge path L2 is reduced to discharge the liquid to the outside of the system. In this way, by controlling the temperature of the liquid in the circulation path to a constant temperature within a required temperature range, it is possible to suppress the temperature drop of the upper flange 12.

As explained above, by controlling the temperature of the liquid discharged from the heat exchange unit 18, that is, the temperature of the liquid in the circulation path to a constant temperature within a required temperature range, the temperature of the inner surface 12A of the upper flange 12 can be loosely controlled within the required temperature range. Further, the temperature and flow rate of the liquid in the circulation path may be set using a table which is made by previously confirming the heating temperature of the component 10 of the semiconductor production apparatus in the cleaning processing furnace 2.

In the present embodiment, the configuration in which the temperature control mechanism 16 measures the temperature of the liquid in the circulation path and the temperature of the inner surface 12A of the upper flange 12 is controlled by heat exchange between the liquid in the circulation path controlled within the required temperature range and the upper flange 12 has been described as an example, but the present invention is not limited to this embodiment. For example, a liquid flow path for cooling and a liquid flow path for heating are provided inside or on the surface of the upper flange 12, respectively, and liquid for cooling or heating is appropriately provided depending on the temperature of the inner surface 12A of the upper flange 12.

As shown in FIG. 1, the temperature control mechanism 17 controls the temperature of the inner surface 13A of the lower flange 13 facing the inside of the furnace. The temperature control mechanism 17 is not particularly limited as long as it can control the temperature of the inner surface 13A of the lower flange 13 within a required temperature range. As such a temperature control mechanism 17, a mechanism that supplies or circulates temperature-controlled liquid is preferable. Similar to the temperature control mechanism 16, the configuration in which the temperature of liquid in the circulation path is controlled by supplying or circulating the temperature-controlled liquid to each of the flanges 13a, 13c, and 13d constituting the lower flange 13 is more preferable.

As described above, since the first temperature control device 7 has a plurality of temperature control mechanisms 16 and 17, the temperature of the upper flange 12 and the lower flange 13 can be controlled independently.

Further, by supplying or circulating the temperature-controlled liquid by at least one or both of the temperature control mechanisms 16 and 17 described above, the temperature can be easily controlled and the installation cost can be reduced.

The temperature-controlled liquid used as the cooling medium and the heating medium is not particularly limited, and liquid which can maintain the inside of the cleaning processing furnace 2 within a required temperature range can be appropriately selected. Among these, when controlling the temperature of the inner surface of the upper flange 12 and the lower flange 13 to 70° C. to 80° C., it is preferable to use water as the temperature-controlled liquid from the viewpoint of safety and economy.

In the present embodiment, the configuration in which the first temperature control device 7 does not have the temperature control mechanism for the reaction tube 11 which is made of quartz and has a high heat resistant temperature and a large heat capacity has been described as an example, but the present invention is not limited to this embodiment. For example, the first temperature control device 7 may include a temperature control mechanism for the reaction tube 11, the temperature control mechanism 16 for the upper flange 12, and the temperature control mechanism 17 for the lower flange 13. With such a configuration, the temperature of the inner surface 2A in the cleaning processing furnace 2 can be controlled more accurately.

As shown in FIG. 1, the second temperature control device 8 maintains the temperature inside the gas discharge pipe 5 within a required range so that the reaction product does not attach to the inside of the gas discharge pipe 5. The second temperature control device 8 is preferably provided in the gas discharge pipe 5 from the outside of the cleaning processing furnace 2 to the trap (not shown). Further, when the gas discharge pipe 5 branches into the main path 5A and the bypass path 5B, the second temperature control device 8 is preferably provided in both paths.

The second temperature control device 8 is not particularly limited as long as it can maintain the temperature inside the gas discharge pipe 5 within a required range. As the second temperature control device 8, a piping heater, a block heater, or the like can be used. It is preferable to use these heaters appropriately according to the shape of the gas discharge pipe 5.

The purge gas supply mechanism 9 supplies a temperature-controlled purge gas from the outside of the cleaning processing furnace 2 toward gaps in the cleaning processing furnace 2. The purge gas supply mechanism 9 includes an inert gas supply source (not shown) as a purge gas supply source, a purge gas supply path (not shown) joined to the inert gas supply source, and a purge gas outlet 9A provided at the tip of the purge gas supply path.

Moreover, the gaps in the cleaning processing furnace 2 are portions in which it is difficult to control the temperature and a surface temperature to a predetermined temperature, such as the connection between the reaction pipe 11 constituting the cleaning processing furnace 2 and the upper flange 12, the connection between the reaction pipe 11 constituting the cleaning processing furnace 2 and the lower flange 13, the portion at which the gas introduction pipe 4, the gas discharge pipe, the rotating shaft 14, and the like penetrate the upper flange 12 and the lower flange 13. By supplying the temperature-controlled purge gas to the gaps in the cleaning processing furnace 2 by the purge gas supply mechanism 9, it is possible to prevent the surface temperature in the cleaning processing furnace 2 from being locally lowered. Therefore, it is possible to prevent the reaction product from attaching to the inner surface of the cleaning processing furnace 2.

<Cleaning System for Component of Semiconductor Production Apparatus>

Next, a cleaning system provided with the cleaning apparatus 1 described above will be described.

Figure 3:
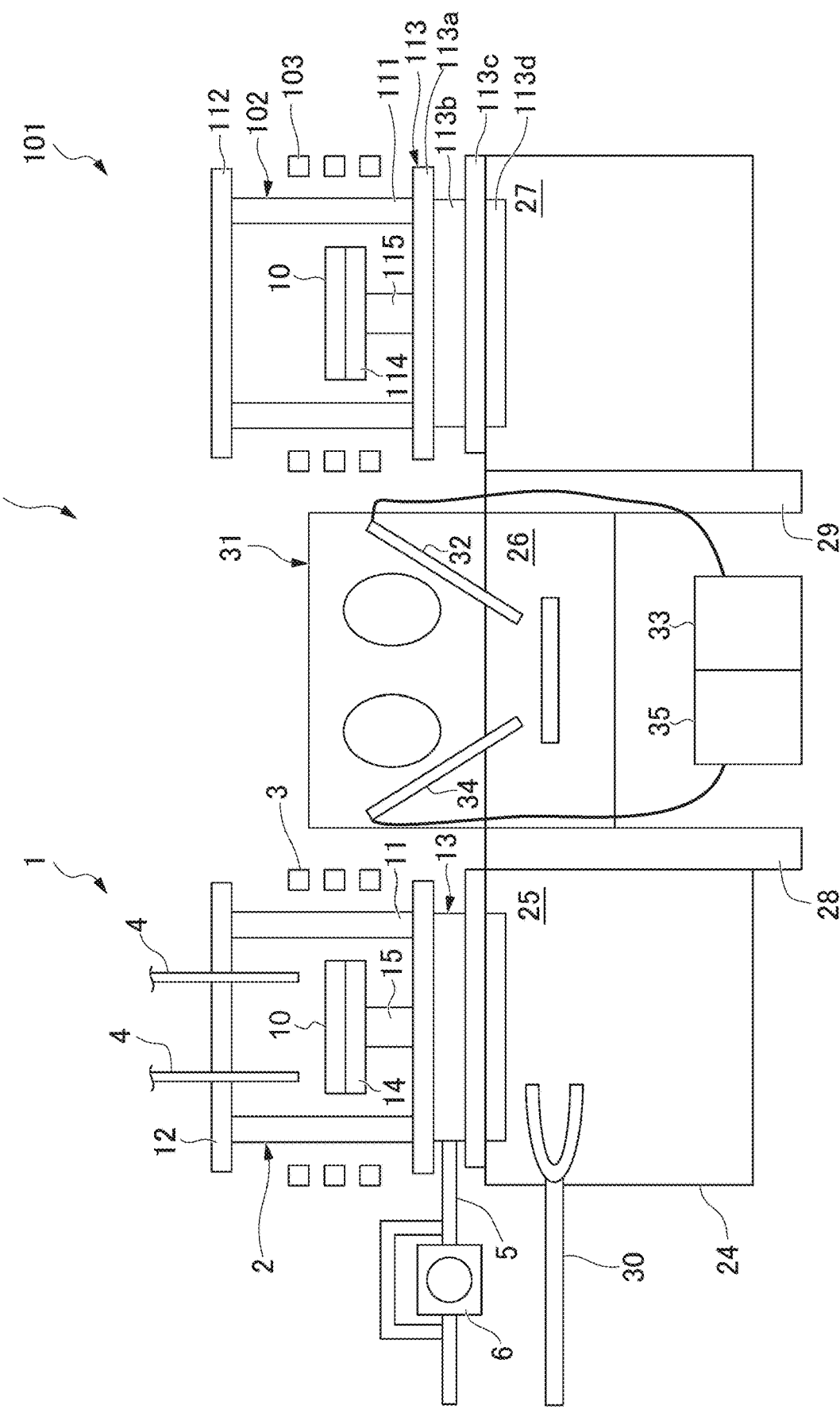
FIG. 3 is a schematic diagram showing a configuration of a cleaning system for a component of a semiconductor production apparatus according to an embodiment of the present invention.
Figure 4:
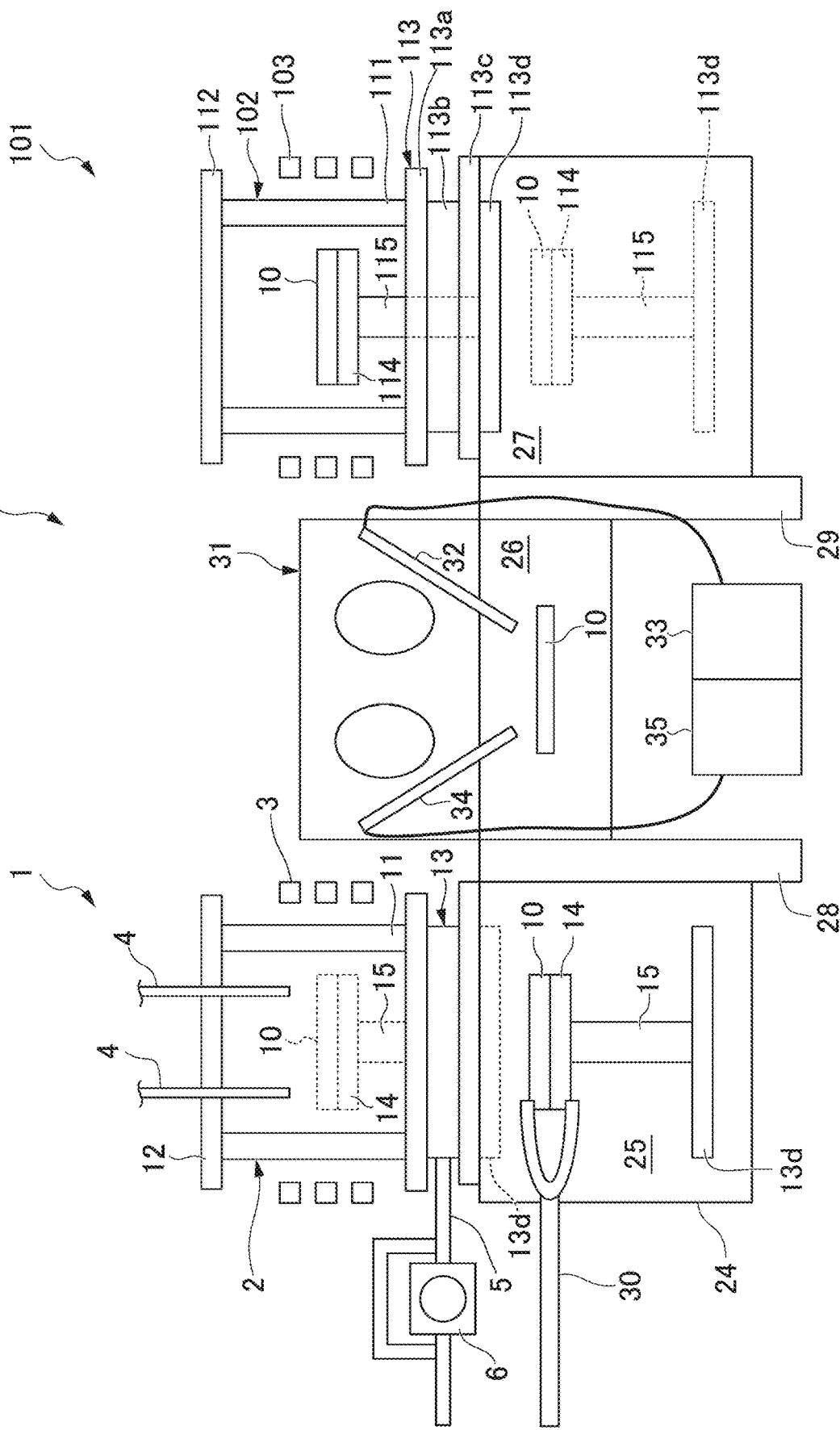
FIG. 4 is a diagram for explaining the delivery of a component of a semiconductor production apparatus in the cleaning system according to an embodiment.

FIG. 3 is a schematic diagram showing an example of a configuration of a cleaning system for a component of a semiconductor production apparatus according to an embodiment of the present invention. Further, FIG. 4 is a diagram explaining the delivery of a component of a semiconductor production apparatus 10 in the cleaning system of the present embodiment.

As shown in FIG. 3, the cleaning system 50 for a component of a semiconductor production apparatus (hereinafter, simply referred to as "cleaning system") of the present embodiment mainly includes a semiconductor production apparatus 101, a cleaning apparatus 1, and a transfer device 24.

(Semiconductor Production Apparatus)

The semiconductor production apparatus 101 is not particularly limited as long as it produces a semiconductor layer or a semiconductor film on the base. As the semiconductor production apparatus 101, for example, an apparatus using a chemical vapor deposition method such as MOCVD or PECVD, or an apparatus using a physical vapor deposition method such as vacuum vapor deposition or molecular beam epitaxy (MBE) can be used. Hereinafter, the case in which the semiconductor device 101 is a CVD film producing device will be described as an example.

The semiconductor device 101 includes a film producing furnace (reaction furnace) 102 in which the component 10 of the semiconductor production apparatus is arranged, and a heating device 103 which heats the base in the film producing furnace 102 to a required temperature.

The film producing furnace 102 includes a reaction tube 111, an upper flange 112, and a lower flange 113.

In the film producing furnace 102, a base 114 on which the component 10 of the semiconductor production apparatus is placed and a rotating shaft 115 supporting the base 114 are provided.

The lower flange 113 includes flanges 113a to 113d, and the flange 113d is an elevating flange. The flange 13d rotatably supports a rotating shaft 115, and the base 114 also moves up and down as the flange 13d moves up and down.

(Transport Device)

The transport device 24 is not particularly limited as long as the component 10 of the semiconductor production apparatus to be cleaned can be delivered between the semiconductor production apparatus 101 and the cleaning apparatus 1.

The transport device 24 has a transport processing space sealed inside. Further, the transfer device 24 has open/close type gate valves 28 and 29 which partition the transfer processing space. The transfer processing space is partitioned into three spaces, a first waiting chamber 25, a blow chamber 26, and a second waiting chamber 27 by the gate valves 28 and 29.

The first waiting chamber 25 is arranged below the cleaning processing furnace 2. As shown in FIG. 4, by opening the elevating flange 13d constituting the lower flange 13 of the cleaning processing furnace 2, the first waiting chamber 25, which is a transport processing space, and the inside of the cleaning processing furnace 2 communicate with each other. Further, by lowering the base 14 together with the elevating flange 13d, the component 10 of the semiconductor production apparatus 10 can be carried out into the first waiting chamber 25 from the lower side of the cleaning processing furnace 2. On the contrary, by raising the base 14 on which the component 10 of the semiconductor production apparatus is placed in the first waiting chamber 25 together with the elevating flange 13d, the component 10 of the semiconductor production apparatus can be carried into the cleaning processing furnace 2 from the first waiting chamber 25.

As shown in FIG. 3, the blow chamber 26 is arranged between the first waiting chamber 25 and the second waiting chamber 27 so as to be adjacent to each other. In the blow chamber 26, the residue which is generated from the oxide layer existing at the top of the film, and may remain after cleaning the component 10 of the semiconductor production apparatus, is removed by blowing. In the blow chamber 26, a glove box 31, a blow nozzle 32, a blower 33, a suction port 34 airtightly connected to the blow nozzle 32 via a pump or the like, and a filter 35 for capturing the residue (fine particles) immediately before the suction side of the blower 33 are provided. Thereby, the residue of the component 10 of the semiconductor production apparatus can be removed by blowing without mixing the atmospheric components.

The second waiting chamber 27 is arranged below the film producing furnace 102. As shown in FIG. 4, by opening the elevating flange 113*d* constituting the lower flange 113 of the film producing furnace 102, the second waiting chamber 27, which is the transport processing space, and the inside of the film producing furnace 102 communicate with each other. Further, by lowering the base 114 together with the elevating flange 113*d*, the component 10 of the semiconductor production apparatus can be carried out into the second waiting chamber 27 from the lower side of the film producing furnace 102. On the contrary, by raising the base 114 on which the component 10 of the semiconductor production apparatus is placed together with the elevating flange 113*d* in the second waiting chamber 27, the component 10 of the semiconductor production apparatus can be carried into the film producing furnace 102 from the second waiting chamber 27.

The transport device 24 has a fork mechanism 30. The fork mechanism 30 can grip the component 10 of the semiconductor production apparatus in the transport processing space. Further, the fork mechanism 30 can move in the horizontal direction in the transport processing space of the transport device 24. That is, by opening the gate valves 28 and 29, the fork mechanism 30 can be horizontally conveyed so as to cross the first waiting chamber 25, the blow chamber 26 and the second waiting chamber 27 while gripping the component 10 of the semiconductor production apparatus.

<Cleaning Method for Component of Semiconductor Production Apparatus>

Next, a cleaning method for a component of a semiconductor production apparatus in this embodiment will be described.

The cleaning method for a component of a semiconductor production apparatus in the present embodiment (hereinafter, simply referred to as a cleaning method) is performed using the cleaning system 50 including the cleaning apparatus 1.

In the present embodiment, a case in which the compound semiconductor (semiconductor) is gallium nitride (GaN), which is a nitride compound semiconductor, and chlorine gas ($Cl_2$) is used as the cleaning gas will be described as an example.

(First Step)

First, the component 10 of the semiconductor production apparatus to which the compound semiconductor (semiconductor) is attached is taken out from the film producing furnace 102 of the semiconductor production apparatus 101 and housed in the cleaning processing furnace 2 of the cleaning apparatus 1.

Specifically, first, as shown in FIGS. 3 and 4, of the lower flange 113 of the film producing furnace 102, the elevating flange 113*d* is opened to communicate the inside of the film producing furnace 102 with the second waiting chamber 27. Next, the base 114 on which the component 10 of the semiconductor production apparatus used for production of a film made of gallium nitride (GaN) is placed is lowered together with the elevating flange 113*d*, and the component 10 of the semiconductor production apparatus is carried into the second waiting chamber 27. Next, the gate valves 28 and 29 are opened, the fork mechanism 30 is moved into the second waiting chamber 27, and then the fork mechanism 30 is moved into the first waiting chamber 25 while holding the component 10 of the semiconductor production apparatus.

Next, the component 10 of the semiconductor production apparatus is placed on the base 14 waiting in the first waiting chamber 25, and the fork mechanism 30 is retracted. Next, the base 14 on which the component 10 of the semiconductor production apparatus is placed is raised together with the elevating flange 13*d* of the lower flange 13 of the cleaning processing furnace 2, and the component 10 of the semiconductor production apparatus is carried into the cleaning processing furnace 2 of the cleaning apparatus 1.

(Second Step)

Next, as shown in FIG. 1, while heating the component 10 of the semiconductor production apparatus, the evacuation inside the cleaning processing furnace 2 is repeated to purge.

Specifically, while heating the component 10 of the semiconductor production apparatus to about 1000° C. by the heating device 3, dry nitrogen gas is supplied into the cleaning processing furnace 2 as a purge gas from the gas introduction pipe 4. After that, the cleaning processing furnace 2 is evacuated by the decompression device 6. By repeating this operation several times, the water remaining in the component 10 of the semiconductor production apparatus and the cleaning processing furnace 2 is removed.

(Third Step)

Next, a cleaning gas is introduced into the cleaning processing furnace 2 to clean the component 10 of the semiconductor production apparatus.

Specifically, while heating the component 10 of the semiconductor production apparatus to about 1000° C., a mixed gas of chlorine gas and nitrogen gas is supplied into the cleaning processing furnace 2 as a cleaning gas from the gas introduction pipe 4. In the cleaning processing furnace 2, gallium nitride ($GaCl_3$) is produced as a reaction product by a vapor phase reaction between gallium nitride attaching to the component 10 of the semiconductor production apparatus and chlorine gas. By removing the gallium nitride attaching to the component 10 of the semiconductor production apparatus in this way, the component 10 of the semiconductor production apparatus is cleaned.

(Fourth Step)

Next, the evacuation in the cleaning processing furnace 2 is repeatedly performed, and the reaction product of the compound semiconductor and the cleaning gas is discharged from the cleaning processing furnace 2 into the gas discharge pipe 5.

Specifically, the heating of the component 10 of the semiconductor production apparatus is stopped, the decompression device 6 is operated, and the gas containing gallium chloride ($GaCl_3$) is discharged from the cleaning processing furnace 2 into the gas discharge pipe 5.

In the cleaning method of the present embodiment, the temperature of the inner surface of the cleaning processing furnace 2 is maintained within a required range during the third step and the fourth step described above.

Specifically, the temperature of the upper flange 12 and the lower flange 13 is independently controlled by the first temperature control device 7.

The temperature of the inner surface of the cleaning processing furnace 2 can be adjusted to 50° C. or higher and 200° C. or lower, preferably 60° C. or higher and 100° C. or lower, and more preferably 70° C. or higher and 80° C. or lower. If the temperature of the inner surface of the cleaning processing furnace 2 is 50° C. or higher, gallium chloride can be efficiently evaporated. If the temperature of the inner surface of the cleaning processing furnace 2 is 200° C. or lower, an inexpensive O-ring having a low heat resistant temperature can be used. If the temperature of the inner surface of the cleaning processing furnace 2 is 100° C. or lower, water can be used as liquid as a cooling medium, and the mechanism is inexpensive and easy to maintain.

When the first temperature control device 7 includes the temperature control mechanisms 16 and 17 and controls the temperature of the upper flange 12 and the lower flange 13 independently, the temperature can be easily controlled by supplying or circulating the temperature-controlled liquid. When water is used as the liquid, it can be operated safely by controlling the temperature to 70° C. or higher and 80° C. or lower.

Figure 5:
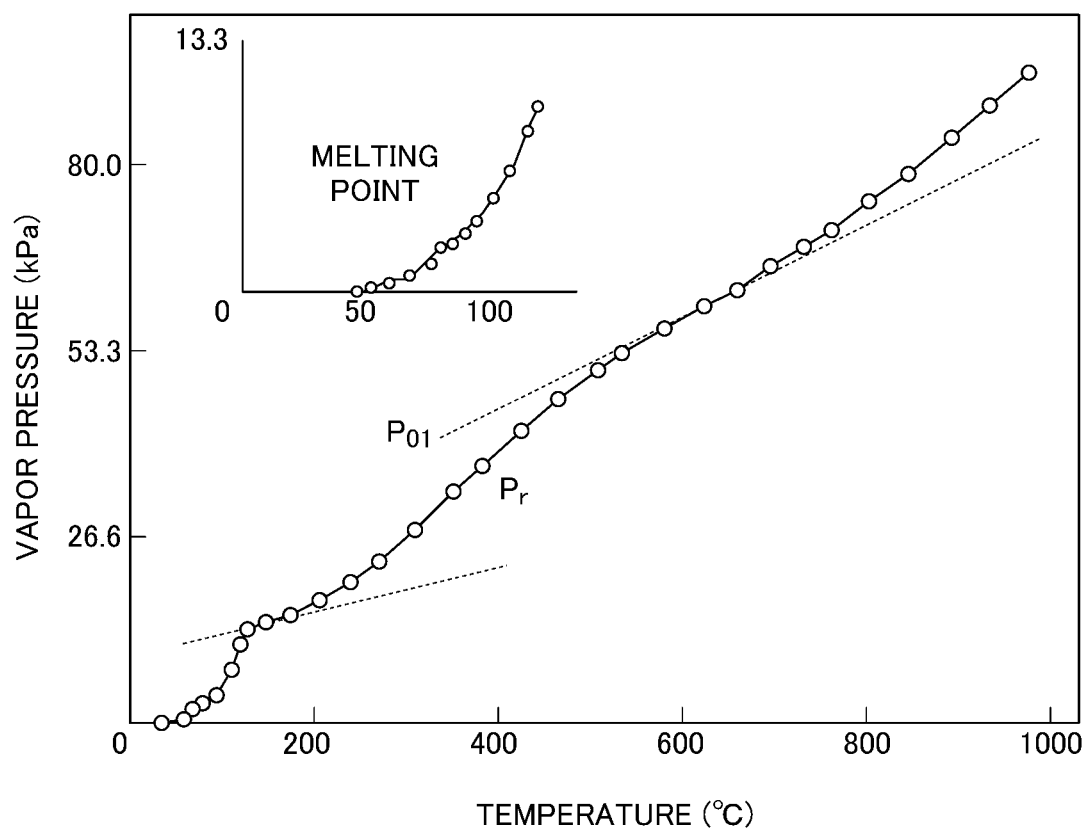
FIG. 5 is a graph showing a vapor pressure curve of gallium trichloride.

FIG. 5 is a graph showing a vapor pressure curve of gallium trichloride.

As shown in FIG. 5, according to the vapor pressure curve of gallium trichloride, the saturated vapor pressure at each temperature is, for example, 6 kPa at 100° C., 2 kPa at 70° C., and almost 0 kPa at 20° C. If the pressure in the cleaning processing furnace 2 falls below the saturated vapor pressure or reaches the same level at a certain temperature, gallium chloride will evaporate quickly.

That is, since gallium chloride and the like have a vapor pressure of about 200° C. at atmospheric pressure, they can be vaporized and exhausted at the temperature (about 1000° C.) during cleaning of the component 10 of the semiconductor production apparatus. However, if some residue remains in the cleaning processing furnace 2 and is cooled to 200° C. or lower, and even to room temperature (about 20° C.), the reaction product may remain unexhausted, causing problems.

The inventors of the present application confirmed that the reaction product is easily evaporated by reducing the pressure inside the cleaning processing furnace 2 and increasing the partial pressure of gallium chloride as a countermeasure against such a problem. At that time, it was also confirmed that the efficiency was improved by further purging the cleaning processing furnace 2. Furthermore, it was also confirmed that by warming the inner surface 2A, which is the gas contact portion in the cleaning processing furnace 2, the compound semiconductor could be easily removed.

However, in the conventional cleaning apparatus which heats the object to be cleaned to a high temperature, components of the cleaning processing furnace which are not subject to heating and have low heat resistant temperatures often deteriorate due to high temperatures. In such a portion, it is common to provide a cooling mechanism for circulating a cooling liquid (for example, water at about 20° C.) so as not to exceed the heat resistant temperature.

However, in the conventional cleaning apparatus, when the heating of the object to be cleaned is stopped, the temperature of the wall (inner surface) of the cleaning processing furnace goes down to the environmental temperature (for example, room temperature of about 20° C.) or the temperature of the cooling water of the cooling mechanism. Then, as described above, the reaction product is not exhausted and remains on the inner surface of the furnace as a residue.

Therefore, as a result of diligent studies, the inventors of the present application found that by changing the temperature of the cooling liquid used for temperature control of the cleaning processing furnace from 20° C., which is a common temperature, to 50° C. or higher and 200° C. or lower, the reaction product does not remain as a residue on the inner surface of the furnace because the inner surface of the furnace is moderately warmed even when the heating is not performed.

Furthermore, the inventors of the present application found that by using water such as city water (cooling water) as the cooling liquid, and utilizing the heat in the furnace during the cleaning process, the temperature of the cooling water can be maintained at 70° C. to 80° C. by only changing the flow rate of the cooling water without using an expensive chiller or the like. Specifically, by providing a path for circulating the liquid and suppressing a sudden change in the temperature of the liquid due to the heat capacity of the liquid, it is possible to suppress a sudden temperature change of the inner surface of the furnace.

Next, in the cleaning method of the present embodiment, a method of controlling the temperature of the upper flange 12 by the temperature control mechanism 16 constituting the first temperature control device 7 between the third step and the fourth step described above will be described.

As shown in FIG. 1, before the start of the third step, the cooling water (liquid) supplied to the supply path L1 using city water (about 20° C.) as a supply source is circulated in the circulation path including the heat exchange unit 18.

Next, when the third step is started, the upper flange 12 constituting the furnace wall is also heated by the radiant heat when the component 10 of the semiconductor production apparatus is heated (for example, 1000° C.) in the cleaning processing furnace 2, and the circulating cooling water is also heated. When the temperature of the cooling water measured by the thermometer 21 provided in the discharge path L2 reaches a preset first threshold value (for example, 80° C.), the first on-off valve 19 provided with the supply path L1 and the second on-off valve 20 provided with the discharge path are opened and a part of the circulating cooling water is replaced to lower the temperature of the liquid. When the temperature of the liquid measured by the thermometer 21 reaches a preset second threshold value (for example, 70° C.), the first on-off valve 19 and the second on-off valve 20 are closed to circulate the cooling water in the circulation path. By repeating this operation, the temperature of the cooling water can be kept at 70° C. to 80° C. and the temperature of the upper flange 12 can be kept below the heat resistant temperature during the third step.

Depending on the temperature rise rate of the cooling water during the third step, it is possible to lower the temperature of the liquid in the circulation path by gradually increasing the flow rate of the unheated liquid from the supply path L1. Such adjustment can be achieved by one or more supply paths L1 (L1A, L1B) via one or more first on-off valves 19 (19A, 19B) of which the opening degree can be adjusted. At the same time, it is preferable that the discharge path L2 have the same configuration.

Next, when the fourth step is started, the heating of the component 10 of the semiconductor production apparatus in the cleaning processing furnace 2 is completed, but the cooling water in the circulation path is warmed by the residual heat for a while. Accordingly, as in the third step, the temperature control of the cooling water is repeated between the first threshold value and the second threshold value.

Next, even if the temperature inside the cleaning processing furnace 2 drops and the temperature of the upper flange 12 constituting the furnace wall becomes less than the second threshold value (for example, 70° C.), the cooling water in the circulation path does not cool rapidly due to its own heat. Therefore, the temperature of the upper flange 12 can be maintained at around 70° C. for a while, that is, until the fourth step is completed, and the effect of warming the inner surface 2A in the cleaning processing furnace 2 is maintained. Compared with the case in which the temperature is constantly controlled, according to such a method, the warming effect is reduced (the time is shortened), but since it is not necessary to install equipment such as an expensive chiller, the economic effect is high.

The configuration and operation method of the temperature control mechanism 16 of the present embodiment is an example, and is not limited to this embodiment. For example, the temperature control area of the upper flange 12 may be divided into a plurality of parts, each of which may be provided with the heat exchange unit, the supply path, the discharge path, and the return path which have the on-off valve may be provided with the heat exchange units serving as temperature-controlled units in parallel, and the first and second threshold values may be set for each heat exchange unit to control the heat exchange units. Thereby, the temperature can be controlled more accurately. Further, the first and second threshold values may be independent or common in the plurality of divided temperature-controlled units.

Further, in the cleaning method of the present embodiment, during the third step and the fourth step above, at least while the cleaning gas stays in the furnace, it is preferable to eject the temperature-controlled purge gas from the purge gas supply mechanism 9 to a portion in the cleaning processing furnace 2 at which temperature control is difficult (that is, a portion in which the temperature may be lower than the required temperature).

The temperature range of the purge gas is not particularly limited. The upper limit of the temperature range of the purge gas is 200° C. or lower, and can be a temperature not exceeding the heat resistant temperature of the members surrounding the cleaning processing furnace 2. The lower limit of the temperature range of the purge gas is preferably 70° C. or higher. By ejecting the temperature-controlled purge gas to a place at which the temperature control of the cleaning processing furnace 2 is difficult, it is possible to more reliably prevent gallium nitride, which is a reaction product, from depositing on the surface inside the cleaning processing furnace 2.

Further, in the cleaning method of the present embodiment, the temperature inside the gas discharge pipe 5 is maintained within a required range during the fourth step described above.

Specifically, the second temperature control device 8 controls the temperature of the gas discharge pipe 5 from the outer portion of the cleaning processing furnace 2 to the trap (not shown). As a result, the precipitation of gallium nitride in the gas discharge pipe 5 can be prevented, and gallium nitride can be reliably captured in the trap (not shown).

The temperature of the inner surface of the gas discharge pipe 5 can be 200° C. or higher and 400° C. or lower, and more preferably 200° C. or higher and 250° C. or lower. When the temperature of the inner surface of the gas discharge pipe 2 is set to 200° C. or higher, the precipitation of gallium nitride, which is a reaction product, can be prevented in the gas discharge pipe 5.

(Fifth Step)

Finally, the component 10 of the semiconductor production apparatus is taken out from the cleaning processing furnace 2 and housed in the film producing furnace 102 of the semiconductor production apparatus 101.

Specifically, first, as shown in FIGS. 3 and 4, of the lower flange 13 of the cleaning processing furnace 2, the elevating flange 13d is opened to communicate the inside of the cleaning processing furnace 2 with the first waiting chamber 25. Next, the base 14 on which the component 10 of the semiconductor production apparatus which has been cleaned is placed is lowered together with the elevating flange 13d, and the component 10 of the semiconductor production apparatus is carried into the first waiting chamber 25. Next, after moving the fork mechanism 30 into the first waiting chamber 25, the gate valve 28 is opened and the fork mechanism 30 is moved to the blow chamber 26 while holding the component 10 of the semiconductor production apparatus.

In the blow chamber 26, particles (for example, residues such as aluminum oxide) scattered on the component 10 of the semiconductor production apparatus after the cleaning treatment are blown and removed. Specifically, the blow nozzle 32 and the suction port 34 are operated from the inside of the glove box 31 to blow and remove the particles scattered on the surface of the component 10 of the semiconductor production apparatus. The method for removing particles in the blow chamber 26 is an example, although the method is not limited to this embodiment. As a removing method, blowing may be combined with blasting or dry ice blasting, or may be removed by suction. Further, a bathtub may be installed in the blow chamber 26 to combine wet cleaning and blowing.

Next, the gate valve 29 is opened while the component 10 of the semiconductor production apparatus in the blow chamber 26 is gripped by the fork mechanism 30, and the fork mechanism 30 is moved to the second waiting chamber 27. Next, the component 10 of the semiconductor production apparatus is placed on the base 114 waiting in the second waiting chamber 27, the fork mechanism 30 is retracted, and then the gate valve 29 is closed. Next, the component 10 of the semiconductor production apparatus is carried into the film producing furnace 102 by raising the base 114 on which the component 10 of the semiconductor production apparatus is placed together with the elevating flange 113d among the lower flanges 113 of the film producing furnace 102.

As described above, according to the cleaning method of the present embodiment, the component 10 of the semiconductor production apparatus can be transported without exposing to the outside air between the inside of the film producing furnace 102 of the semiconductor production apparatus 101 and the inside of the cleaning processing furnace 2 of the cleaning apparatus 1 by using the transfer device 24.

As described above, according to the cleaning apparatus 1, the cleaning system 50, and the cleaning method using the cleaning apparatus 1 and the cleaning system 50 of the present embodiment, it is possible to prevent the residue of the reaction product from remaining on the surface of the reaction tube 11, the upper flange 12, and the lower flange 13 constituting the cleaning processing furnace 2 by a simple structure. Therefore, when the reaction product is a highly corrosive chloride such as gallium chloride and the upper flange 12 and the lower flange 13 made of metal are exposed to the atmosphere due to the opening of the cleaning processing furnace 2, these members are not corroded.

Further, according to the cleaning apparatus 1, the cleaning system 50, and the cleaning method of the present embodiment, by controlling the temperature of the inner surface of the cleaning processing furnace 2 to the range of 70° C. to 80° C. at least while the cleaning gas stays in the cleaning processing furnace 2, all of the reaction product deposited by the subsequent vacuum replacement (attainment pressure of about 300 Pa) is evaporated. Further, in the present embodiment, as the decompression device 6, a commercially available inexpensive rotary pump, a dry pump (the ultimate vacuum degree is about several hundred Pa) or the like can be used.

The technical scope of the present invention is not limited to the embodiments above, and various modifications can be made without departing from the spirit of the present invention.

For example, in the embodiment above, the cleaning processing furnace 2 including the reaction tube 11 which is made of quartz and has the upper end opening and the lower end opening, the metal upper flange 12 for closing the upper end opening, and the metal lower flange 13 for closing the lower end opening has been described. However, the present invention is not limited to this embodiment.

Figure 6:
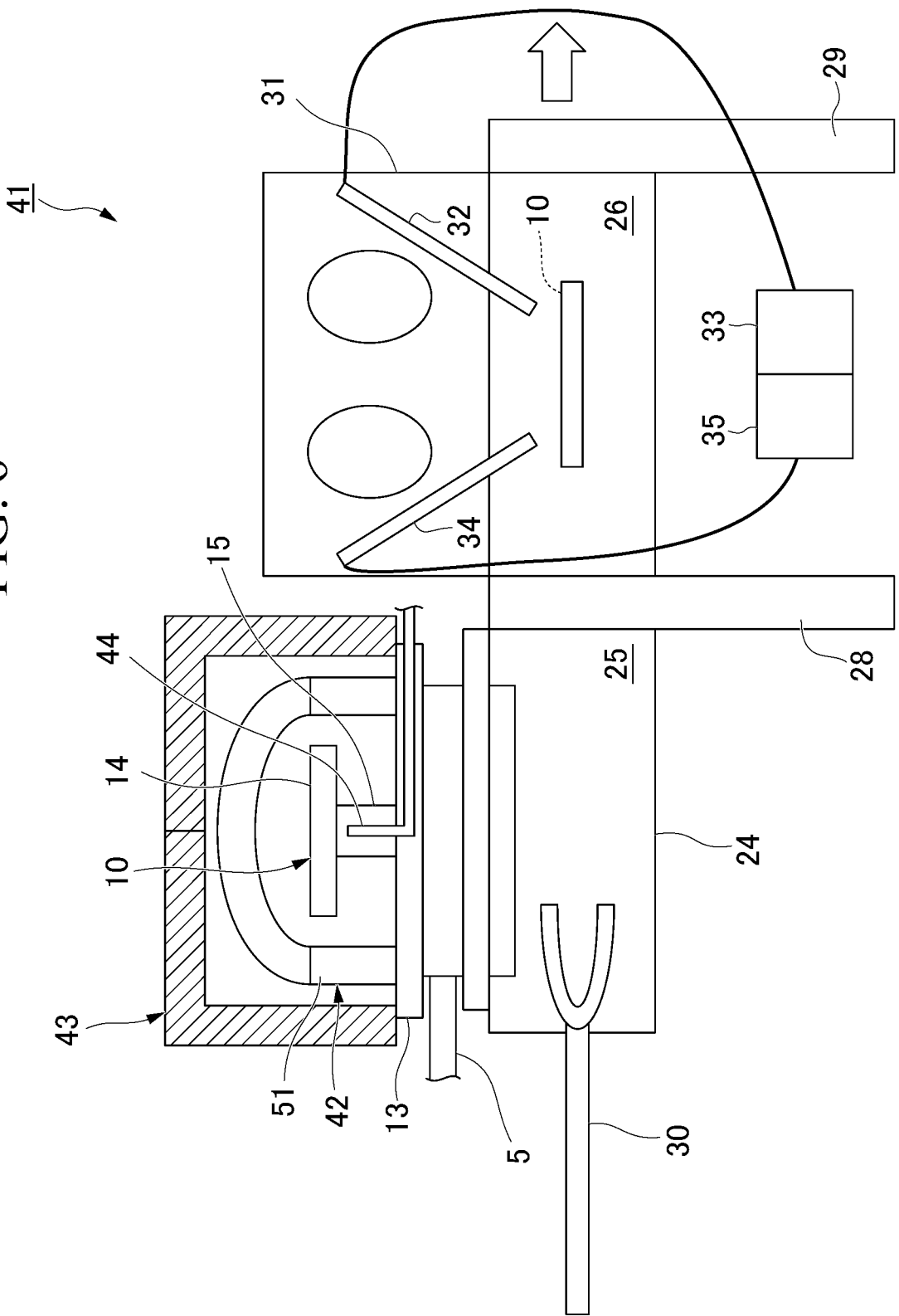
FIG. 6 is a cross-sectional diagram schematically showing a configuration of a cleaning apparatus for a component of a semiconductor production apparatus according to another embodiment of the present invention.

FIG. 6 is a cross-sectional diagram schematically showing a configuration of a cleaning apparatus for a component of a semiconductor production apparatus according to another embodiment. As shown in FIG. 6, the cleaning apparatus 41 of another embodiment may include a cleaning processing furnace 42 which includes a reaction tube 51 which is made of quartz and has an opening at the lower end and a lower flange 13 which is made of metal and closes the opening at the lower end of the reaction tube 51. In this case, it is preferable that the upper end of the reaction tube 51 have a structure such as a bell jar shape which can withstand evacuation. As a result, the temperature control mechanism 16 for the upper flange 12 which constitutes the cleaning apparatus 1 of the embodiment above can be omitted.

Further, as shown in FIG. 1, in the cleaning apparatus 1 of the embodiment above, the configuration in which a heating coil is used as the heating device 3 has been described as an example, but the present invention is not limited to this embodiment. For example, as shown in FIG. 6, the cleaning apparatus 41 according to another embodiment may have a configuration in which a heating heater covering the side surface and the upper end of the reaction tube 51 is used as the heating device 43.

Further, in the cleaning apparatus 1 of the embodiment above, the configuration in which the gas introduction pipe 4 penetrates the upper flange 12 has been described as an example, but the present invention is not limited to this embodiment. For example, as shown in FIG. 6, in the cleaning apparatus 41 according to another embodiment, the gas introduction pipe 44 may be configured to penetrate the lower flange 13 and the rotating shaft 15.

Further, in the cleaning apparatus 1 of the embodiment above, the configuration in which the base (stage) 14 has a rotation mechanism has been described as an example, but the present invention is not limited to this embodiment. For example, the base 14 may have a configuration which does not have a rotation mechanism. Specifically, the inside of the cleaning processing furnace 2 can be made airtight by using a support column instead of the rotating shaft 15 and fixing the support column to the elevating flange 13d. Therefore, the purge gas supply mechanism 9 can be omitted.

Further, in the cleaning apparatus 1 of the embodiment above, the configuration in which the cleaning processing furnace 2 is a vertical furnace has been described as an example, but the present invention is not limited to this embodiment. For example, a horizontal furnace in which the axial direction of the reaction tube is horizontal may be used.

Further, when the cleaning apparatus 1 of the embodiment above is airtightly connected to the semiconductor production apparatus (not shown) via the transport processing space 25, the second step may be omitted in the cleaning method above. Further, in the cleaning method described above, the component 10 of the semiconductor production apparatus may be transported at a high temperature for the purpose of shortening the time.

EXAMPLE

A GaN-based nitride HEMT structure containing an AlN layer was grown by 5 μm on a substrate using a MOCVD apparatus. Then, components in the MOCVD furnace arranged around the base were cleaned using the cleaning apparatus 1 shown in FIG. 1 according to the following conditions and procedures.

<Conditions>
Heating temperature during cleaning: 900° C.
Internal pressure of cleaning processing furnace: atmospheric pressure
Cleaning gas: a mixed gas of chlorine (1 L/min) and nitrogen (9 L/min)
Cleaning time: 60 minutes (per batch)

<Procedure>
(1) Place the component in cleaning processing furnace 2
(2) Purge while evacuating the inside of cleaning processing furnace 2
(3) Heat the component and raise the temperature to the heating temperature
(4) Start the supply of the cleaning gas in the cleaning processing furnace 2
(5) Stop the supply of cleaning gas and start lowering the temperature
(6) Evacuate inside cleaning processing furnace 2
(7) Start lowering temperature
(8) When the temperature inside the cleaning processing furnace 2 drops below 300° C., take out the component and cool it further outside the furnace After the cleaning was completed, the surface of the cleaned component taken out from the cleaning processing furnace 2 was visually observed, but no residue was observed.

In addition, the residue at the place at which the deposit was located was collected with a carbon tape and observed with a scanning electron microscope. Furthermore, the residue was analyzed using an energy dispersive X-ray analyzer. As a result of these observations and analyses, gallium nitride, which is the main component of the deposit, and gallium, aluminum, and nitrogen, which are the constituent elements of aluminum nitride, were not detected on the surface of the components after cleaning. However, white foil-like powder was observed, but it was blown off.

When the temperature was lowered to room temperature and the inside of the cleaning processing furnace 2 was observed, no precipitation of the reaction products was found and no offensive odor was observed.

When the cleaned component was installed again in the MOCVD apparatus and epi-growth of the GaN-based nitride HEMT structure was performed on the base in the same manner as the previous time, it was confirmed that the film thickness on the base and crystallinity were the same as the previous time.

EXPLANATION OF REFERENCE NUMERAL 1, 41 cleaning apparatus for a component of a semiconductor production apparatus (cleaning apparatus)
2, 42 cleaning processing furnace
3, 43 heating device
4, 44 gas introduction pipe
5 gas discharge pipe
6 decompression device 7 first temperature control device
8 second temperature control device
9 purge gas supply mechanism
10 component of a semiconductor production apparatus
11, 51 reaction tube
12 upper flange
13, 53 lower flange
14 base (stage)
15 rotation axis
16 first temperature control mechanism
17 second temperature control mechanism
18 heat exchange unit
19 first on-off valve
20 second on-off valve
21 thermometer (temperature measuring device)
22 pump (pumping device)
24 conveying device
25 first waiting chamber
26 blow room
27 second waiting chamber
28, 29 gate valve
30 fork mechanism
31 globe box
32 blow nozzle
33 blower
34 suction port
35 filter
50 cleaning system for a component of a semiconductor production apparatus (cleaning system)
101 semiconductor production apparatus
L1 to L3 path

The invention claimed is:

1. A cleaning apparatus for a component of a semiconductor production apparatus on which a semiconductor is attached,
wherein the cleaning apparatus comprises:
a cleaning processing furnace which is configured to house the component of a semiconductor production apparatus, the cleaning processing furnace comprising a reaction tube that has an opening at least at one end and a first flange configured to close the opening;
a heating device which is configured to heat the component of a semiconductor production apparatus in the cleaning processing furnace;
a decompression device which is configured to evacuate the inside of the cleaning processing furnace;
a gas introduction pipe which is configured to introduce a cleaning gas capable of reacting with the semiconductor into the cleaning processing furnace;
a gas discharge pipe which is configured to discharge a reaction product of the semiconductor and the cleaning gas from the cleaning processing furnace;
a first temperature control device which is configured to maintain a temperature of an inner surface of the cleaning processing furnace within a required temperature range, the first temperature control device comprising a plurality of cooling mechanisms that are configured to independently control a temperature of a plurality of portions at the inner surface of the cleaning processing furnace in the reaction tube and the first flange; and
a second temperature control device which is configured to maintain a temperature inside of the gas discharge pipe within a required temperature range.

2. The cleaning apparatus for a component of a semiconductor production apparatus according to claim 1, wherein the reaction tube is made of quartz and the first flange is made of metal.

3. The cleaning apparatus for a component of a semiconductor production apparatus according to claim 1, wherein the reaction tube is made of quartz and has openings at both ends, a first flange which is made of metal and configured to close the opening at one end, and a second flange which is made of metal and configured to close the opening at the other end.

4. The cleaning apparatus for a component of a semiconductor production apparatus according to claim 1, wherein at least one of the cooling mechanisms is provided on one or both of an inner surface of the first flange facing the inside of the cleaning processing furnace and an outer surface of the first flange opposite to the inner surface.

5. The cleaning apparatus for a component of a semiconductor production apparatus according to claim 1, wherein the plurality of cooling mechanisms are based on one or both of the supply of liquid and the circulation of liquid.

6. The cleaning apparatus for a component of a semiconductor production apparatus according to claim 5, wherein each of the plurality of cooling mechanisms comprises:
one or more heat exchange units comprising a flow path of the liquid which is provided on one or both of the inner surface of the first flange facing the inside of the cleaning processing furnace and the outer surface of the flange opposite to the inner surface;
one or more supply paths which are configured to supply the liquid into the heat exchange unit;
one or more discharge paths which are configured to discharge the liquid from the heat exchange unit;
one or more return paths which are configured to branch from the one or more discharge paths, and join with the one or more supply paths to return a part of the liquid in the discharge path to the supply path;
one or more first on-off valves which are provided in the supply path and configured to adjust an amount of the liquid supplied into the heat exchange unit stepwise or continuously;
one or more temperature measuring devices provided with the discharge path; and
one or more pumping devices which are provided with the return path.

7. The cleaning apparatus for a component of a semiconductor production apparatus according to claim 1, wherein the cleaning apparatus further comprises a purge gas supply mechanism which is configured to supply a temperature-controlled purge gas from the outside of the cleaning processing furnace toward gaps of the cleaning processing furnace.

8. The cleaning apparatus for a component of a semiconductor production apparatus according to claim 1, wherein the semiconductor is a nitride-based compound semiconductor which is represented by a general formula: $Al_xIn_yGa_{1-x-y}N$ (wherein x and y satisfy $0 \leq x < 1$, $0 \leq y < 1$, $0 \leq x+y < 1$), and the cleaning gas is a chlorine-based gas.

9. A cleaning method for a component of a semiconductor production apparatus, wherein the cleaning method uses the cleaning apparatus according to claim 1, and comprises:
a housing step in which the component of a semiconductor production apparatus on which a semiconductor is attached is housed in the cleaning processing furnace;
a purging step in which while heating the component of a semiconductor production apparatus, an inside of the cleaning processing furnace is evacuated repeatedly to purge the inside of the cleaning processing furnace;

a cleaning step in which a cleaning gas is introduced into the cleaning processing furnace to clean the component of a semiconductor production apparatus; and a discharging step in which evacuation inside of the cleaning processing furnace is carried out repeatedly to discharge a reaction product between the semiconductor and the cleaning gas from the cleaning processing furnace into a gas discharge path;

during introducing the cleaning gas into the cleaning processing furnace to clean the component of a semiconductor production apparatus, evacuating repeatedly an inside of the cleaning processing furnace, and discharging the reaction product between the semiconductor and the cleaning gas from the cleaning processing furnace into the gas discharge path, a temperature of an inner surface of the cleaning processing furnace is maintained within a required range, and during discharging the reaction product between the semiconductor and the cleaning gas from the cleaning processing furnace into the gas discharge path, a temperature inside of the gas discharge path is maintained within a required range.

10. A cleaning system for a component of a semiconductor production apparatus, wherein the cleaning system comprises:

a semiconductor production apparatus which is configured to produce a layer or a film of a semiconductor on a base in a film producing furnace in which the component of a semiconductor production apparatus is installed; and a cleaning apparatus for a component of a semiconductor production apparatus according to claim 1, which is configured to clean the component of a semiconductor production apparatus on which a semiconductor is attached.

11. A The cleaning system for a component of a semiconductor production apparatus according to claim 10, wherein the cleaning system further comprises a transfer device which is configured to deliver the component of a semiconductor production apparatus between the semiconductor production apparatus and the cleaning apparatus for a component of a semiconductor production apparatus.

12. The cleaning system for a component of a semiconductor production apparatus according to claim 11, wherein a transport processing space in the transfer device communicates with an inside of the cleaning processing furnace.

13. The cleaning system for a component of a semiconductor production apparatus according to claim 12, wherein the transfer device comprises one or more gate valves which are configured to partition the transfer processing space into two or more.

* * * * *